United States Patent
Klaver et al.

(10) Patent No.: US 8,585,418 B2
(45) Date of Patent: Nov. 19, 2013

(54) ELECTRICAL AND MECHANICAL CONNECTION DEVICE FOR AN ELECTRONIC MODULE IN A RACK

(75) Inventors: Jean-Nöel Klaver, Pessac (FR); Eric Rauscent, Lormont (FR); Christian Cavailles, Saint Sebastien de Morsent (FR); Stèphane Fabre, Bordeaux (FR)

(73) Assignee: Thales, Neuilly sur Sein (FR)

( * ) Notice: Subject to any disclaimer, the term of this patent is extended or adjusted under 35 U.S.C. 154(b) by 56 days.

(21) Appl. No.: 13/429,290

(22) Filed: Mar. 23, 2012

(65) Prior Publication Data

US 2012/0244740 A1   Sep. 27, 2012

(30) Foreign Application Priority Data

Mar. 24, 2011  (FR) ...................................... 11 00885

(51) Int. Cl.
*H01R 13/62*   (2006.01)

(52) U.S. Cl.
USPC ........................................................ 439/157

(58) Field of Classification Search
USPC ............ 312/333, 332.1, 221, 223.2; 292/100; 439/157, 159, 160, 152, 296, 267, 439/928.1, 946
See application file for complete search history.

(56) References Cited

U.S. PATENT DOCUMENTS

| 5,261,202 | A  | 11/1993 | Brunet et al. |
| 5,307,238 | A  | 4/1994  | Marcus |
| 6,612,870 | B1 | 9/2003  | Rauscent |
| 7,131,623 | B2 | 11/2006 | Alric et al. |
| 7,429,137 | B2 | 9/2008  | Sontag et al. |
| 8,075,334 | B2 | 12/2011 | Sontag et al. |

FOREIGN PATENT DOCUMENTS

| EP | 0 323 926 A1 | 7/1989 |
| FR | 2 787 282 A1 | 6/2000 |
| FR | 2 846 510 A1 | 4/2004 |
| FR | 2 938 022 A1 | 5/2010 |
| WO | WO 2008/040783 A1 | 4/2008 |

OTHER PUBLICATIONS

French Search Report for France Counterpart Patent Application No. 11008885, 7 pgs. (Nov. 7, 2011).

*Primary Examiner* — Alexander Gilman
(74) *Attorney, Agent, or Firm* — Blakely Sokoloff Taylor & Zafman LLP

(57) ABSTRACT

The general field of the invention is that of electrical and mechanical connection devices for an electronic module in a rack, the electronic module comprising a first connector and the rack comprising a second connector complementing the first connector. In the connection device according to the invention, the first connector is mounted in a lateral recess on the side of the module, the second connector is mounted with free rotation in the rack on supports which also include a locking handle for ensuring the electrical and mechanical connection of the module in the rack. This device applies particularly to the display devices mounted on aircraft instrument panels.

5 Claims, 3 Drawing Sheets

ELECTRICAL AND MECHANICAL CONNECTION DEVICE FOR AN ELECTRONIC MODULE IN A RACK

FIELD

The field of the invention is that of electrical and mechanical connection devices for electronic modules in racks designed to ensure a secure connection. The preferred field of application is that of aeronautics and in particular that of aircraft instrument panels that include a number of display screens. However, this device can have a wide number of applications, in particular in the professional electronics fields which require secure connections.

BACKGROUND

In a certain number of applications, a maintenance operator has to be able to connect and fasten an electronic module with another element simply and securely, without being able to make a mistake. The connection system must also satisfy very strict standards and regulations. In the aeronautics field, the main constraints of a connection device are:
- mounting and dismantling the module without tools;
- very good mechanical resistance of the assembly. In the aeronautics field, the module has to be able to withstand a shock corresponding to an acceleration of 11 G for a duration of 6 ms, which is called "crash safety";
- resistance to severe environments such as vibrations, extreme temperatures and humidity;
- mandatory transport handle;
- round geometry of the mechanical interfaces;
- use of non-magnetic and non-inflammable materials;
- good visibility of the device so as to check that the mounting is correctly done;
- mandatory polarizing system;
- when they exist, easy access to the controls of module such as control knobs;
- total visibility of the image if the module is a display device.

Connection systems have been developed to address these various imperatives. These systems generally comprise a handle for transporting the electronic module and for locking, also called "racking", the electronic module in its rack.

Thus, FIG. 1 represents a first embodiment of a connection device according to the prior art. The electronic module 1 which comprises a display screen 10 is equipped with a multifunction handle 2 comprising locking cams 6. Connectors which are not visible in FIG. 1 are situated on the rear of the electronic module. The connection is made via a seat 3 equipped with pins 4 mounted on springs. Once the electronic module 1 is inserted into the seat 3, the action on the handle 2 pulls on the pins 4 by means of the cams 6 and forces the electronic module 1 to the end of its travel and to establish the connection, both electrical and mechanical. The semicircular white arrow indicates the movement of the locking handle 2 when fitting the module.

FIG. 2 represents a variant of the preceding device. In this connection device, the seat 3 is more compact and the handle 2 of the preceding device is replaced by a drawer system 7. The action on this drawer drives two clamps 8 to rotate and grip the pins 4 of the seat, mounted on springs. Once the drawer 7 is closed, the connection is made. The straight white arrow indicates the movement of the drawer 7 when fitting the module 1.

These systems have a number of defects. The bulk of the connection interface is very significant. These systems also induce stresses due to the wiring situated on the rear part of the electronic module. In the first system, since the lever arm is weak, the force to be imparted on the handle by the operator to install the electronic module is significant. Furthermore, this handle is reinforced to avoid any deformation. Finally, since the tightening force is not parallel to the force needed to mate the connectors situated at the rear of the screen, a spurious rotation movement of the connection occurs that has to be compensated with shims. All these modifications incur additional costs.

SUMMARY

The connection device according to the invention does not have the above drawbacks. This device has two important innovations compared to the devices of the prior art. The connection is always made by a handle, but the latter is positioned at the rear of the module, totally freeing up the front face of the module. Finally, the connection system used allows for a lateral connection parallel to the front face, which considerably reduces the bulk of the connection system and also reduces the tightening force which is now situated in the axis of the connectors. A connection system or a connector has connection pins which are either male or female. These pins are all oriented in a certain direction. A lateral connection should be understood to be a connection system in which the direction of the pins is parallel to the front face of the module comprising this connection system. When it is a display device, the front face is the display screen.

More specifically, the subject of the invention is an electrical and mechanical connection device for an electronic module in a rack, the substantially parallelepipedal-shaped module having a front face, four sides and a rear face, the rack comprising a rectangular opening with dimensions close to those of the front face, the electronic module comprising a first connector and the rack comprising a second connector complementing the first connector, characterized in that the connection device comprises:
- mounted on the rack,
  - two identical supports situated on either side of two of the sides of the opening, the second connector being mounted on said supports with free rotation, and;
  - first fastening means;
- on one of the sides of the module,
  - a recess comprising the first connector, said recess arranged so as to receive the second connector and;
  - second fastening means complementing the first fastening means and arranged so that, the second connector being arranged in the recess of the electronic module, the second fastening means block said second connector in the module.

Advantageously, the device comprises:
- mounted on the rack, third fastening means;
- mounted on the front face of the module, fourth fastening means complementing the third fastening means and arranged so that, when the second connector is blocked in its recess, the fourth fastening means block the module in the rack.

Advantageously, the first fastening means are a locking handle with cams also mounted with free rotation on the supports, each cam including, at the level of each support, an opening, the second fastening means being two locking fingers complementing the openings of the two cams. In the locked position, the locking handle is positioned along the rear face of the module.

Finally, the rack is an aircraft instrument panel rack and the module is a display device, the front face of the module being the display screen.

BRIEF DESCRIPTION OF DRAWINGS

The invention will be better understood, and other advantages will become apparent, on reading the following description given as a nonlimiting example and through the appended figures in which.

DETAILED DESCRIPTION

Figure 3:
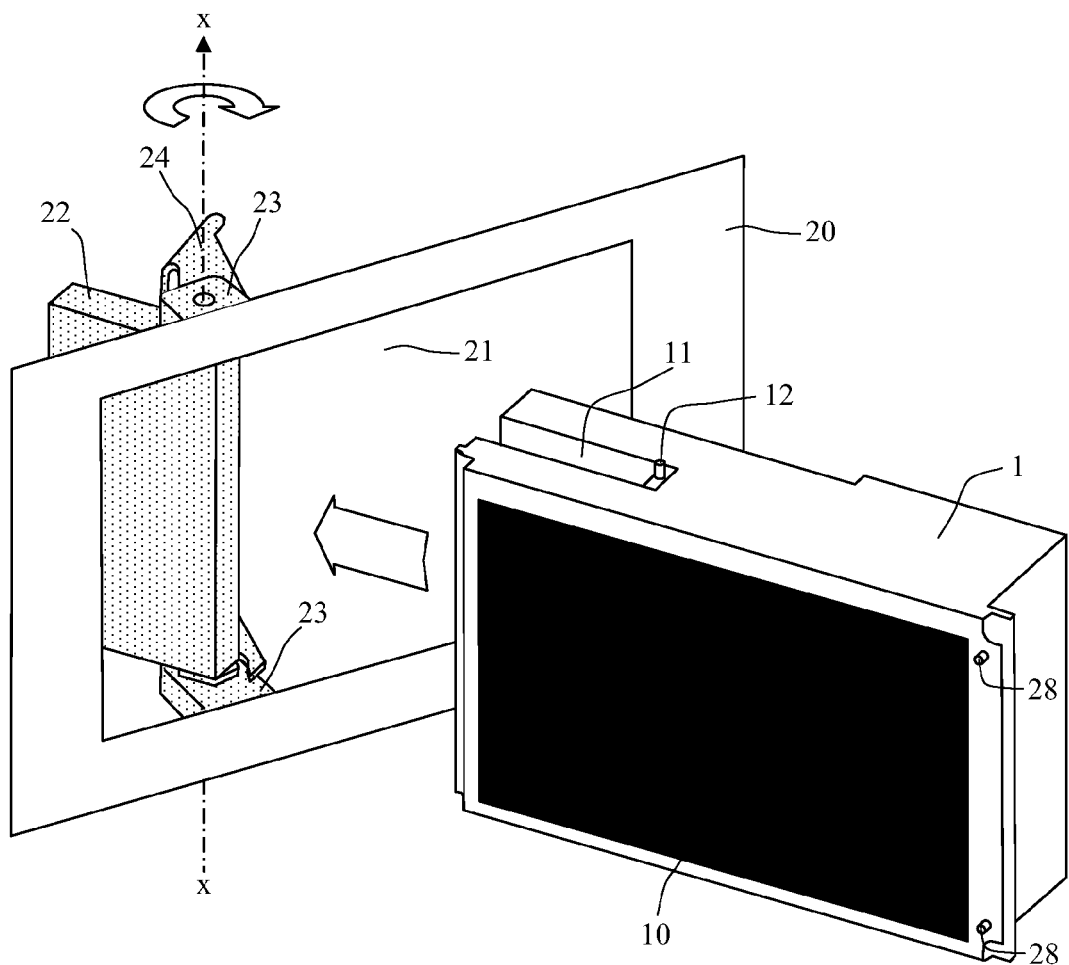
FIG. 3, already discussed, represents a general view of the connection device according to the invention before locking.

As a nonlimiting example, FIG. 3 represents a general view of the connection device according to the invention before locking.

The module 1 to be connected in the rack 20 is substantially parallelepipedal in shape and has a front face, four sides and a rear face. This module is, in the present case, a display device comprising, on the front face, a display screen 10, and the rack is an aircraft instrument panel. The electronic module comprises a first connector positioned laterally at the bottom of a recess 11. The recess 11 is positioned on one of the sides of the module 1. The rack also comprises two locking fingers 12 situated on two opposite sides of the rack and on either side of the recess 11.

The rack 20 in which this module is mounted and is connected comprises a rectangular opening 21 with dimensions close to those of the front face 10. It comprises a second connector 22 complementing the first connector of the module. This second connector is mounted in a casing which can fit perfectly in the recess 11.

The rack 20 also comprises two identical supports 23 situated on either side of two of the sides of the opening 21, the second connector 22 is mounted on the supports 23 with free rotation on axes 27 according to a rotation axis xx positioned parallel to the plane of the opening and parallel to one of the sides of the opening 21. These supports 23 may either be machined in the bulk of the rack, or added to and mounted on the rack.

The rack finally comprises, mounted on the same supports 23 and on the same axes 27, a locking handle 24 comprising two cams 25, each cam situated on a support 23. This handle constitutes a lever device with gear reduction effect, with a rotation about the axis xx. Each cam 25 comprises an opening 26, the profile of which is calculated so as to be able to exert a variable and determined force on the locking finger 12 of the rack when it is positioned in said opening 26 and when the locking handle is rotated about its rotation axis.

Figure 1:
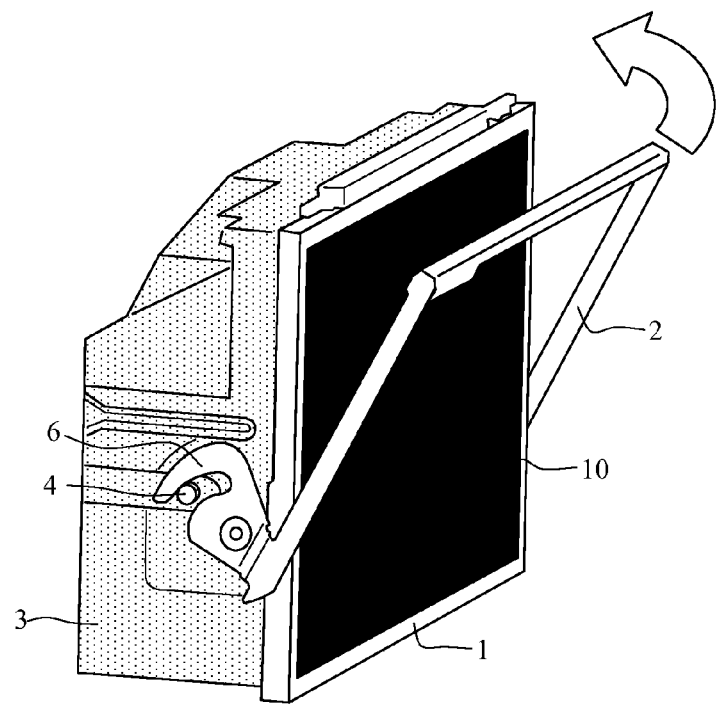
FIG. 1, already discussed, represents a first device according to the prior art.
Figure 2:
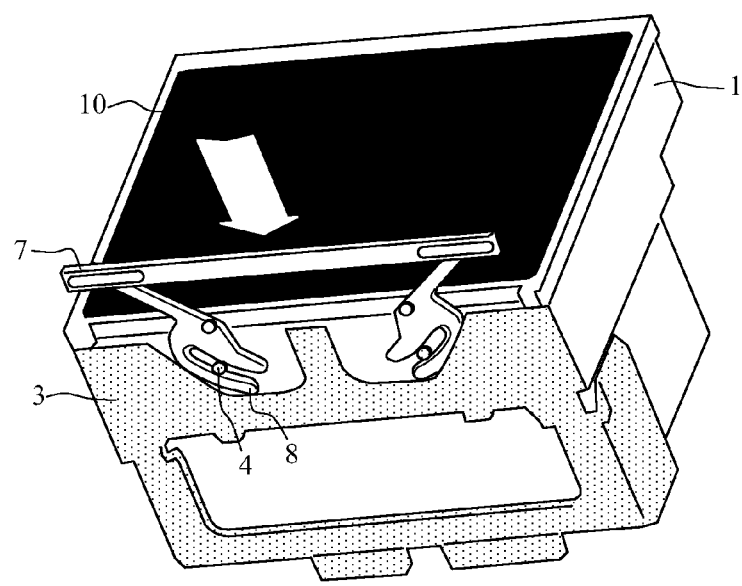
FIG. 2, already discussed, represents a second device according to the prior art.

The connection device according to the invention requires a connection system arranged laterally on the module and not on the rear face of the module as is the case on the modules of FIGS. 1 and 2. This type of connection system is currently developing very rapidly. This is because, due to the incessant technological changes, flat screen display screens are becoming more refined year by year. The connectors are disappearing from the rear of the equipment to be located on the sides so as to fit within the small thickness of the screen. Thus, the connection device according to the invention takes account of this inevitable trend.

The method for mounting and locking the module in its rack is simple and comprises the following three steps.

In a first step, the electronic module 1 is fitted by a user in the rack by a translational movement indicated by the white arrow of FIG. 3 in such a way that the second connector of the rack enters into the recess 11 of the module. In this step, the electronic module is held by the two hands of the user. When the first and the second connectors are sufficiently fitted, one hand is then enough to hold the electronic module 1. The top and bottom fingers 12 of the module are then facing the openings of the top and bottom cams of the handle.

Figure 4:
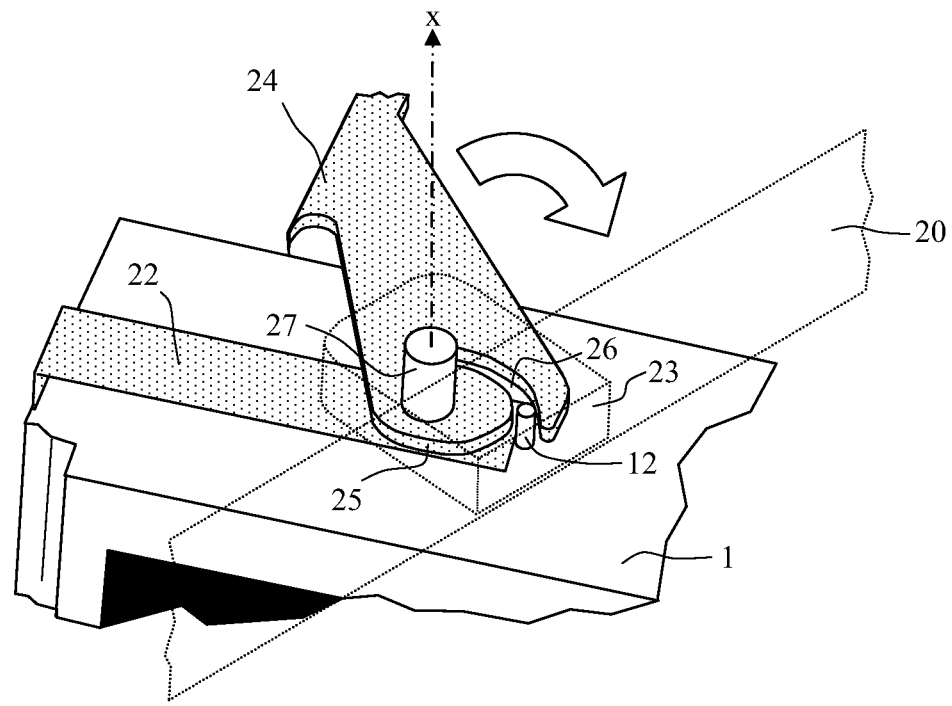
FIG. 4 represents a partial view of the connection device according to the invention during locking.
Figure 5:
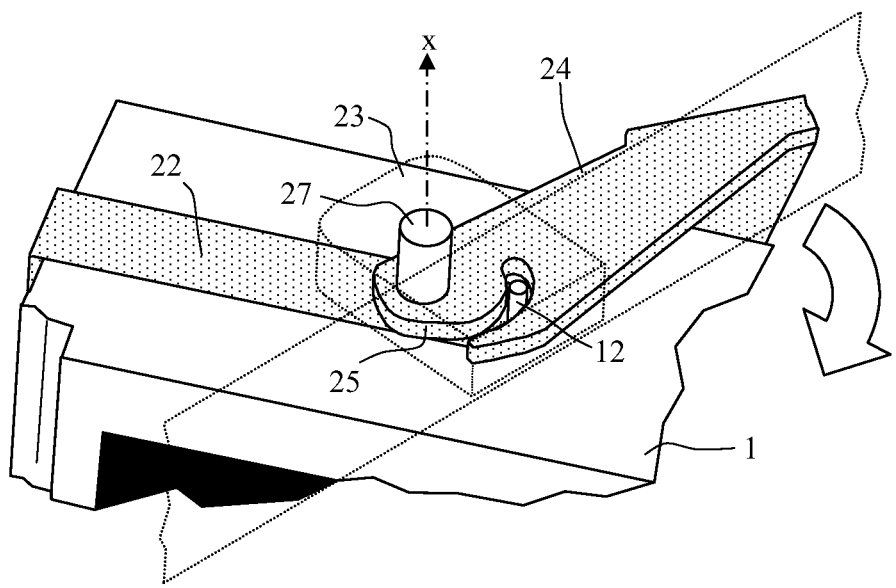
FIG. 5 represents a partial view of the connection device according to the invention after locking.

In a second step illustrated in FIGS. 4 and 5, the user rotates the locking handle. These figures are partial views and represent the position of the handle at two locking instants, at the start and at the end of the manoeuvre. In these two figures, and in order to make them more clear, the rack 20 and the support 23 are shown transparently by dotted lines so as to reveal one of the two cams of the handle. The rotation of the locking handle 24 with lever device with gear reduction effect makes it possible to finish coupling the first and second connectors. The rotation of the handle is illustrated, in these figures, by a semicircular white arrow. During this operation, the user exerts a sufficient force so that each locking finger 12 moves along the opening 26 of a cam 25. At the end of this second step, the locking handle is then abutting on the rear of the module 1 in a recess provided for this purpose. The second connector is then blocked and abutting in its recess. The module can then rotate in the rack by rotation about the axis xx.

In a third and final step, the user rotates the module about the rotation axis xx and presses the module against the rack so that the front face 10 is flush with the opening 21. Once the electronic module 1 is bearing on the rack, a locking takes place in order to hold this position. This locking can, for example, be provided by thumbscrews 28 as represented in FIG. 3, or any other fast locking system.

The connection device according to the invention has many advantages.

The system is simple and lightweight and has little bulk. The bulk of the connectors is contained within the volume of the electronic module, thus making all of the rear of the electronic module available for other specific connection systems. In an aircraft instrument panel application, the bulk saving due to the lateral connection system is approximately 300 millimeters on the depth of the instrument panel. The connection system is compatible with the new display screens that have a lateral connection system. Furthermore, the locking handle is at the rear of the module and is absolutely not visible when the module is mounted in its rack, which is visually highly favourable.

The connection device has good electromagnetic compatibility in as much as the connector is insulated in its recess.

Furthermore, the connection method is easy to implement. It requires no tools. It comprises three simple steps, which are:

- a translation, to engage the connector of the rack in the recess of the module;
- an action on the locking handle to ensure a secure connection between the two connectors;
- finally, a rotation to place the module in abutment and ensure that the equipment is held in the operational position.

What is claimed is:

1. Electrical and mechanical connection device for an electronic module in a rack, the substantially parallelepipedal-shaped module having a front face, four sides and a rear face, the rack comprising a rectangular opening with dimensions close to those of the front face, the electronic module comprising a first connector and the rack comprising a second connector complementing the first connector, wherein the connection device comprises:
   mounted on the rack,
      two identical supports situated on either side of two of the sides of the opening, the second connector being mounted on said supports with free rotation, and;
      first fastening means;
   on one of the sides of the module,
      a recess comprising the first connector, said recess arranged so as to receive the second connector and;
      second fastening means complementing the first fastening means and arranged so that, the second connector being arranged in the recess of the electronic module, the second fastening means block said second connector in the electronic module.

2. Electrical and mechanical connection device according to claim 1, wherein the device comprises:
   mounted on the rack, third fastening means;
   mounted on the front face of the module, fourth fastening means complementing the third fastening means and arranged so that, when the second connector is blocked in its recess, the fourth fastening means block the module in the rack.

3. Electrical and mechanical connection device according to claim 1, wherein the first fastening means are a locking handle with cams also mounted with free rotation on the supports, each cam including, on of each support, an opening, the second fastening means being two locking fingers complementing the openings of the two cams.

4. Electrical and mechanical connection device according to claim 3, wherein, in the locked position, the locking handle is positioned along the rear face of the electronic module.

5. Electrical and mechanical connection device according to claim 1, wherein the rack is an aircraft instrument panel rack and in that the electronic module is a display device, the front face being the display screen.

* * * * *